United States Patent [19]

Chism et al.

[11] Patent Number: 4,947,113

[45] Date of Patent: Aug. 7, 1990

[54] DRIVER CIRCUIT FOR PROVIDING PULSES HAVING CLEAN EDGES

[75] Inventors: Wayne R. Chism, Greeley; Philip N. King, Fort Collins, both of Colo.

[73] Assignee: Hewlett-Packard Company, Palo Alto, Calif.

[21] Appl. No.: 332,243

[22] Filed: Mar. 31, 1989

[51] Int. Cl.$^5$ .................. G01R 31/02; H03K 5/12; H03K 19/092

[52] U.S. Cl. .................. 324/158 R; 307/263; 307/475; 371/20.1

[58] Field of Search ........... 324/73 PC, 73 R, 73 AT, 324/158 R, 128, 73.1; 371/20, 27, 20.1; 307/263, 475

[56] References Cited

U.S. PATENT DOCUMENTS

| | | |
|---|---|---|
| 3,781,689 | 12/1973 | Marshall et al. . |
| 3,965,468 | 6/1976 | Bronson . |
| 4,439,858 | 3/1984 | Petersen .................. 324/73 AT |
| 4,507,576 | 3/1985 | McCracken et al. ............. 324/73 R |
| 4,588,945 | 5/1986 | Groves et al. . |

OTHER PUBLICATIONS

Zehntel Advertisement, Electronics Magazine, May 12, 1988 edition.

*Primary Examiner*—Ernest F. Karlsen

[57] ABSTRACT

A method and apparatus for providing pulse signals from a driver circuit in an in-circuit overdrive/functional tester to a probe, which tester provides a control signal representative of a command for the driver circuit to provide logic signals, includes adjusting the transition time of the logic signals so that the transition time is equal to twice the time it takes the pulse signal to travel from the driver circuit to the end of the probe and back. The method or apparatus for adjusting the rise time of the control signal can include adjusting the slew rate of the control signal. Pulse signals produced by such a method or apparatus have clean edges, have slew rates which are twice as fast as the slew rates of the driver signals and have zero propagation delay when measured at the fifty percent point.

7 Claims, 3 Drawing Sheets

DRIVER CIRCUIT FOR PROVIDING PULSES HAVING CLEAN EDGES

FIELD OF THE INVENTION

The present invention relates to the field of circuit board testing and more particularly to the field of functional and "in-circuit" testing of digital devices and printed circuit boards.

BACKGROUND OF THE INVENTION

As the use and complexity of digital circuits has increased in the last decade, so also has the need to test such circuits increased in order to ensure proper operation. Basically, two types of digital circuit test techniques have been developed, namely functional test techniques and so-called in-circuit test techniques.

In functional test techniques a known digital pattern is applied to the circuit input and the circuit output is compared to an expected response. Any differences between the actual and expected outputs provide an indication of improper circuit operation. Unfortunately, this technique only provides information regarding overall operation of a circuit, for example a circuit which has been assembled onto a printed circuit board. For failure diagnostic purposes it is very often desirable to test individual circuit elements or groups of elements which have been assembled onto a printed circuit board apart from the overall circuit.

In in-circuit testing techniques, testing is performed on a circuit element or elements isolated from the remainder of the circuit. In-circuit testing techniques generally involve the application of a preselected digital pattern to the input of an individual circuit element, a so-called device under test (DUT), followed by the comparison of the DUT response to an expected response. Since the circuit element or elements under test typically are connected to other circuit elements, it is necessary to overdrive any digital pattern or signal which is being applied by an "upstream" circuit element or logic device. Upstream logic devices are those devices whose outputs normally drive the inputs of the DUT. An overdrive signal is a signal which is superimposed at a selected location in a circuit.

In order to perform multiple simultaneous tests on several individual circuit elements mounted on a single printed circuit board, test devices such as that disclosed in U.S. Pat. No. 4,588,945 were developed. In such devices a printed circuit board having circuit elements mounted thereon is in turn mounted or affixed to a so-called bed-of-nails fixture. Each nail acts as an individual probe either providing a preselected signal to or receiving an output signal from a DUT. As described in that patent, a controller module applies multiple pregenerated signal patterns to multiple DUTs through a driver module. The DUT responses are received through a sensor module and compared to expected responses.

The present invention focuses on improvements to the driver module circuitry to be used for both the in-circuit testing of devices (such as that disclosed in U.S. Pat. No. 4,588,945) and for the functional testing of devices. A discussed in that patent, the driver module is made up of a multiplicity of identical driver circuits which generate the actual voltage signals provided to selected probes or nails in the test bed or bed-of-nails. These circuits each provide logic high, logic low and an "off" state, i.e. the so-called tri-state. Unfortunately, when combined with the necessary interface to the bed-of-nails, these driver circuits have experienced some problems during operation, in particular, the presence of so-called stair-stepping or ringing characteristics in the rising or falling edges of the output signal.

The ringing or stair-stepping problem with the driver signal manifests itself at the end of the transmission line which connects the driver circuit to the DUT. This ringing or stair-stepping is caused by the unterminated nature of the transmission line. In particular test situations, the problem is that the ringing or stair-stepping in the driver circuit signal will cause the signal to be misinterpreted by the DUT. For instance, if ringing or stair-stepping is present in the driver signal, the DUT may interpret such a phenomenon as so-called double clocking: detecting more than one edge or input when only one is expected. As a consequence, the DUT response may be substantially different than the expected response, even though the DUT may be an acceptable device. Thus, such ringing or stair-stepping would lead to a false determination of a bad DUT.

SUMMARY OF THE INVENTION

The advantages of the present invention are achieved in a method and apparatus for providing clean functional and in-circuit test logic signals to a DUT, that is, signals that do not exhibit ringing or stair-stepping characteristics at the DUT. The invention comprises adjusting the transition-time of the driver logic signals which are presented to the DUT so that it is equal to twice the time it takes the logic signal to travel from the driver circuit to DUT and back. The transition time is the time required for the signal to rise (fall) from one logic level to another. This transition time is also commonly referred to as the logic signal's rise (fall) time. The method or apparatus for adjusting the transition time of the driver signal can include adjusting the slew rate of a control signal which determines the driver output edge rate. Driver logic signals produced by such a method or apparatus exhibit the following characteristics at the DUT: clean edges, that is, no ringing or stair-stepping; slew rates which are twice as fast as the slew rates of the driver signals as measured at the driver; and zero propagation delay when measured at the fifty percent point between logic levels.

DETAILED DESCRIPTION

Figure 1A:
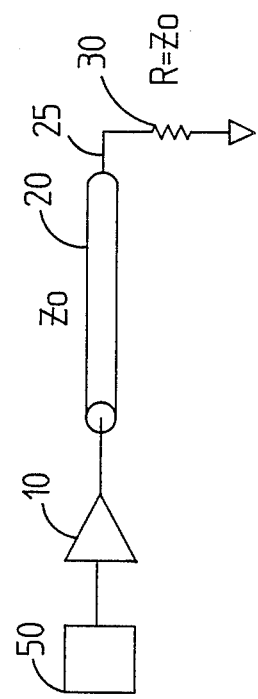
FIGS. 1A and 1B are schematic drawings of a driver circuit having a terminated transmission line.
Figure 1B:
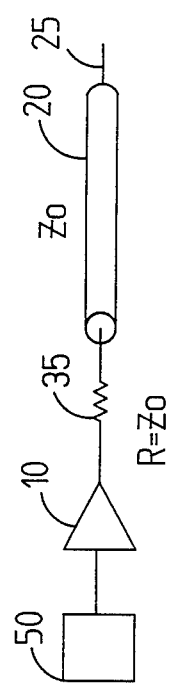

FIGS. 1A and 1B are schematic drawings of a driver circuit having a terminated transmission line. Driver circuit 10 generates a logic signal, which signal may occupy one of three states, logic high (1), logic low (0) or off (tri-state). The driver logic signal generated by driver 10 is determined by user-controlled control circuitry 50. The driver logic signal generated by driver 10 is transmitted to probe 25 via transmission line 20. Transmission line 20 has a characteristic impedance Zo. Probe 25 is representative of a single probe nail in the bed-of-nails which would be used to activate a DUT in a circuit board tester. For the sake of explanation of the present invention, we can safely assume that a given DUT pin would require application of only a single logic probe so that probe 25 serves to represent the bed-of-nails in a circuit board tester. In FIG. 1A, transmission line 20 is terminated by endpoint termination resistor 30 to ground. In FIG. 1B line 20 is effectively terminated due to the presence of the driving point series termination resistance 35 at the output of driver 10. Both of these termination configurations would produce clean edges but they would not meet the combined needs of both in-circuit and functional tests.

Figure 2:
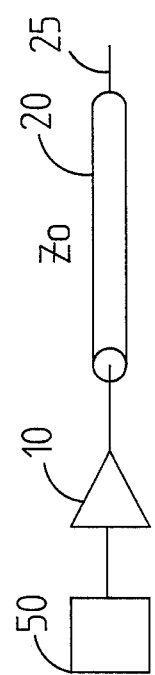
FIG. 2 is a schematic drawing of a driver circuit having an unterminated transmission line.

FIG. 2 is a schematic drawing of a driver circuit having an unterminated transmission line; note that there is no output resistance at the output of driver 10 and there is no resistance to ground at the end of probe 25. This configuration is typically used in a bed-of-nails tester for in-circuit and functional tests.

Figure 3:
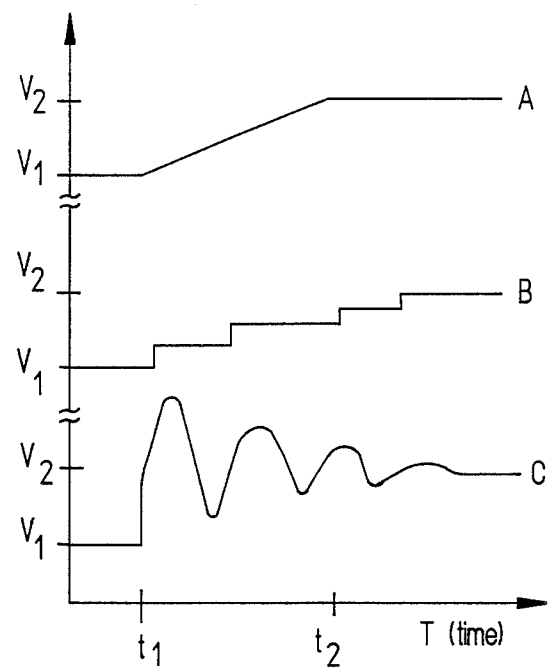
FIG. 3 shows examples of driver logic signals having clean (signal A), stair-stepped (signal B) and ringing characteristics (signal C)

FIG. 3 shows examples of driver logic signals having clean (signal A), stair-stepped (signal B) and ringing characteristics (signal C). Signal A is an example of a driver logic signal exhibiting a clean transition from logic level V1 to logic level V2. Signal A is representative of the clean-edged signal which can be delivered to a DUT in a terminated transmission line circuit such as shown in FIGS. 1A and 1B. Signals B and C are representative examples of the stair-stepping and ringing characteristic defects, respectively, that would likely be exhibited by a driver logic signal delivered over an unterminated transmission line circuit such as is shown in FIG. 2. Note that in the transition from logic level V1 to logic level V2, stair-stepping (signal B) or ringing (signal C) may occur in the case of an unterminated line. All three signals, A, B and C are intended to represent a transition from logic level V1 to logic level V2. However, unlike signal A, signals B and C could be easily misinterpreted by a DUT. (In general, ringing occurs when the signal's transition time is short compared to the time it takes for the signal to travel the length of the transmission line. In general, stair-stepping occurs when the transition time is long compared to the time it takes for the signal to travel the length of the line.)

Figure 4:
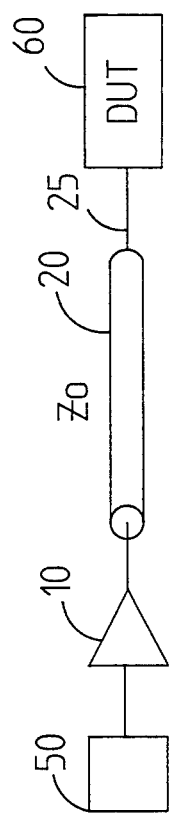
FIG. 4 shows a signal path from a driver circuit, through a transmission line to a DUT.

FIG. 4 shows a signal path from a driver circuit, through a transmission line and to a DUT. FIG. 4 is representative of a circuit board testing situation which approximates the unterminated transmission line circuit of FIG. 2 because typically a driver circuit, such as driver circuit 10 in FIG. 4., will have very low output resistance and be driving a load which is essentially and open circuit, as in FIG. 4, that is, there is no terminating resistance either in series or in parallel with transmission line 20. The result is the driver logic signal transmitted to DUT 60 may exhibit stair-stepping or ringing defects such as signal B or C, respectively, of FIG. 3.

Thus, if the driver circuit of FIG. 4 is to be utilized in functional testing, it is desirable to provide fast clean rising and falling edge output signals, i.e., signals which do not exhibit ringing or stair-stepping characteristics in the rising o falling edges. To this end a method and apparatus have been developed which provide the desired edge shape.

Consider the electrical path shown in FIG. 4. A driver circuit 10 provides a signal through a controlled impedance path indicated by transmission line 20 to a so-called bed-of-nails probe 25. As indicated previously, such a signal is provided in response to a control signal from control circuit 50.

Normally, in view of the unterminated nature of this interconnect, i.e., very low output impedance driver and high impedance load with no series or parallel termination resistors, one would expect to see ringing or stair-stepping characteristics exhibited at probe 25 due to reflections occurring at the interface between probe 25 and DUT 60. It has been discovered that a relationship exists between rising and falling edge times and signal propagation time down an electrical path which, when used properly, permits very clean waveforms to be provided to the DUT in an unterminated environment.

Figure 5:
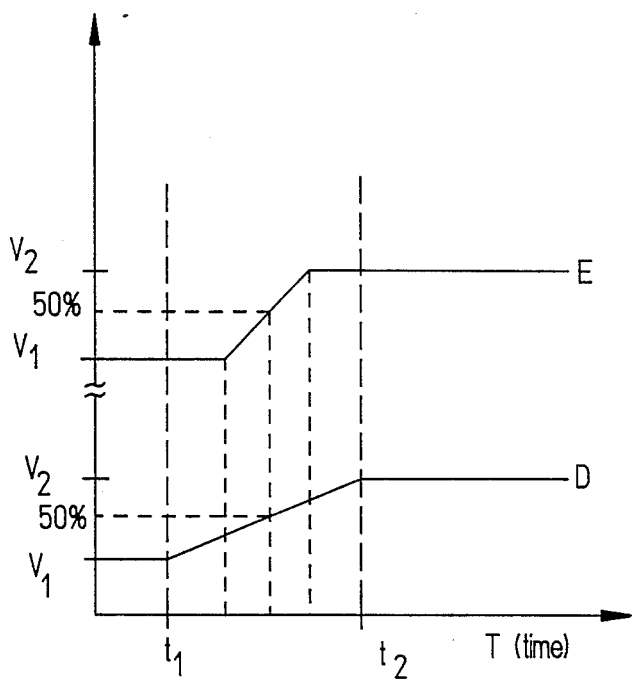
FIG. 5 shows the effect of the present invention on a driver logic signal as presented to a DUT.

For the purposes of this application the time it takes a signal to travel from the driver 10 to probe 25 and back shall be referred to as the round trip propagation time P. Also, as used in this application the terms rise time and fall time refer to the time it takes a signal to transition between the two selected logic levels, such levels V1 and V2 in FIGS. 3 and 5.

So long as the rise or fall time of the driver circuit output signal is equal to twice $P_t$, the signal seen at probe 25 will be clean, that is, exhibit no ringing or stair-step characteristics. Such clean signals are the result of interactions between the incident and reflected edges on the controlled impedance transmission line 20. By forcing the rise times and fall times to equal twice $P_t$, the interactions cause the sources of ringing and stair-stepping to cancel, yielding clean edges. This result is shown graphically in FIG. 5., where $2P_t = (t2 - t1)$. The result is that whereas signal D is the output signal of driver 10, signal E is the signal presented at DUT 60 on probe 25 such that the desired logic level, V2, is cleanly presented to DUT 60 without ringing or stair-stepping.

Two additional effects result from the above described time/electrical length relationship. First, by making the rise or fall times equal to twice $P_t$, the slew rate of the edge (also referred to as the edge rate) seen at probe 25 is twice as fast as the edge rate seen at the driver 10. This is due to the open ended nature of the line where voltage doubling occurs. Such an effect enhances the ability of the interface to propagate high speed digital signals. Second, as a result of the doubling of the edge rate, the propagation delay from driver 10 to probe 25 is effectively zero when measured at the fifty percent (50%) point, which is also typically the threshold point for many families of logic devices. Consequently precise calibration of the driver timing accuracy is much easier to achieve.

It is possible to control the rising and falling edge time by controlling the slew rate of the driver output signal. As the slew rate becomes higher the rate of rise or fall increases and vice versa. It is possible to control the slew rate of the output of the driver circuit 10 by controlling the slew rate of the input control signal to driver 10 by controller 50. In effect the slew rate of the output of driver circuit 10 will follow the slew rate of the input control signal provided by controller 50. Since many devices are known for controlling the slew rate of signals of the type utilized as the input control signal, it is not necessary to describe any particular circuit for use in controller 50. Also, since techniques are known for measuring signal travel time, such techniques need not be repeated here.

It should be noted that the method described for preventing driver circuit output signals from exhibiting ringing or stair-stepping characteristics can be reduced to an automatic operation. It will be necessary to determine P for each probe nail in relation to its associated driver circuit, however once done such information could be stored in memory for use by the test controller.

The above detailed description of the invention has discussed adjustment of the driver signal transition time such that the transition time equals $2P_t$. In addition, the object of the invention, that is, clean-edged signals at the DUT, can also be achieved by fixing the transition time and then adjusting the length of the transmission line such that transition time equals $2P_t$. Thus, either the transition time or the length of the transmission line may be adjusted to achieve the crucial relationship between the transition time of the logic signal and the round trip propagation time $P_t$: (transition time)=$2P_t$.

While the invention has been described and illustrated with reference to specific embodiments, those skilled in the art will recognize that modification and variations may be made without departing from the principles of the invention as described herein above and set forth in the following claims.

We claim:

1. A method for use in both in-circuit and functional circuit board testing, for providing clean edged logic pulse signals from a driver circuit to a probe in a circuit board tester, which tester provides a control signal to said driver circuit which control signal is representative of a command for said driver circuit to provide logic pulse signals to said probe, comprising the steps of:
   providing logic pulse signals to said probe in response to said control signal; and
   controlling the transition time of said logic pulse signals so that said transition time is equal to twice the round trip propagation time from said driver circuit to the end of said probe.

2. The method of claim 1, wherein the step of adjusting the transition time of said logic pulse signals comprises adjusting the slew rate of said logic signals.

3. The method of claim 1, wherein the step of adjusting the transition time of said logic pulse signals comprises adjusting the slew rate of said control signal.

4. An apparatus for use in both in-circuit and functional circuit board testing, for providing clean edged logic pulse signals to a probe in a circuit board tester, which tester provides a control signal representative of a command to provide logic pulse signals to said probe, comprising:
   a driver circuit for providing logic pulse signals to said probe in response to said control signal; and
   transition time adjustment means, connected to said driver circuit, for controlling the transition time of said logic pulse signals so that said transition time is equal to twice the round trip propagation time from said driver circuit to the end of said probe.

5. The apparatus of claim 4, wherein said transition time adjustment means comprises slew rate adjustment means for adjusting the slew rate of said logic signals, 6. The apparatus of claim 4, wherein said transition time adjustment means comprises slew rate adjustment means for adjusting the slew rate of said control signal.

7. An apparatus for performing both in-circuit and functional circuit board testing, said apparatus having a plurality of probes for applying logic pulse signals to a circuit board under test, said apparatus comprising:
   driver means for generating said signals, said signals having a predetermined fixed transition time between at least two predetermined logic levels; and
   transmission means for transmitting at least one of said signals from said driver to said circuit board under test via at least one of said probes, said transmission means having a predetermined length for assuring that the round trip propagation time for said one signal to travel between said driver means and said circuit board under test is equal to twice said transition time.

* * * * *